United States Patent [19]

Thompson

[11] 4,251,298
[45] Feb. 17, 1981

[54] HETEROSTRUCTURE LASER

[75] Inventor: George H. B. Thompson, Sawbridgeworth, England

[73] Assignee: International Standard Electric Corporation, New York, N.Y.

[21] Appl. No.: 10,875

[22] Filed: Feb. 9, 1979

[30] Foreign Application Priority Data

Feb. 14, 1978 [GB] United Kingdom ......... 05811780/78

[51] Int. Cl.³ ............................................. H01L 21/208
[52] U.S. Cl. .................... 148/171; 148/33.5; 148/172; 331/94.5 H; 357/16
[58] Field of Search ............... 148/171, 172, 33.5; 357/16, 18; 331/94.5 H

[56] References Cited

U.S. PATENT DOCUMENTS 4,033,796   7/1977   Burnham et al. ............... 148/171 X Primary Examiner—G. Ozaki
Attorney, Agent, or Firm—John T. O'Halloran

[57] ABSTRACT

A laser p-n junction is formed in a structure consisting of a pair of layers of opposite conductivity type grown by liquid phase epitaxy and having sandwiched therebetween a quantity of active material of higher refractive index and lower band gap. The layers are grown on a substrate having a groove in its surface under conditions such that the active material is thicker in the region overlying the center of the groove than elsewhere and where a dopant is diffused through one of the layers to translate the portions of the p-n junction not overlying the groove into the material of the other layer while leaving the portion of the p-n junction overlying the center of the groove bounded on at least one side by the lower band-gap active material.

5 Claims, 5 Drawing Figures

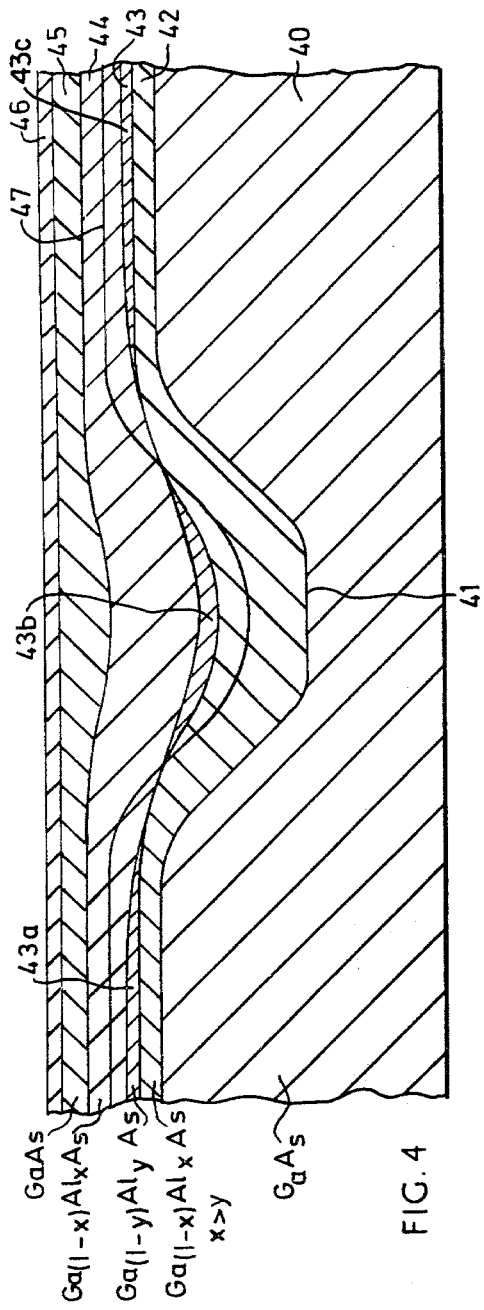
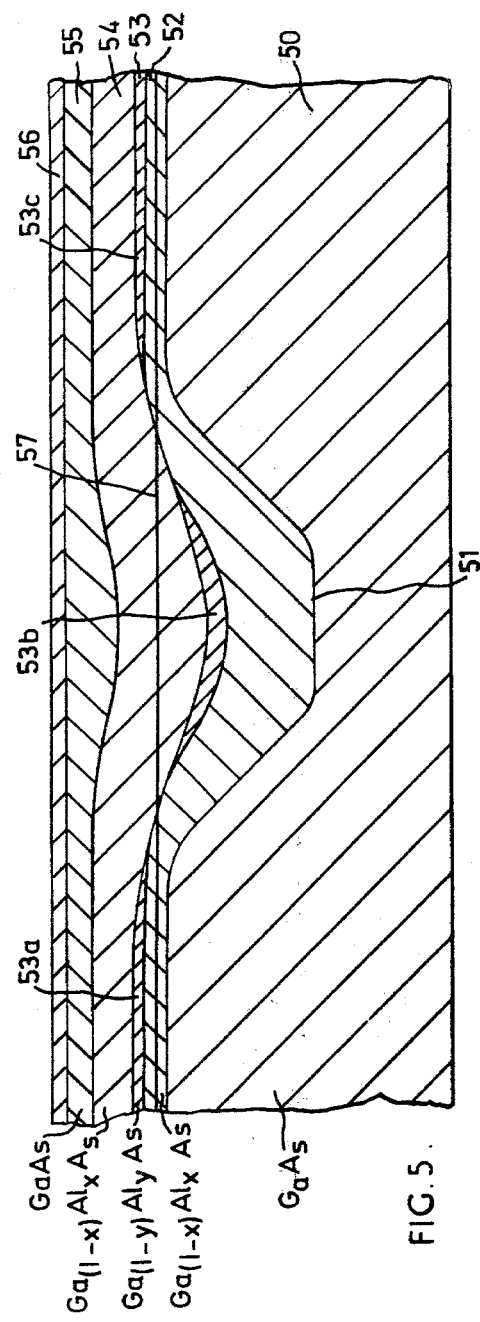

HETEROSTRUCTURE LASER

BACKGROUND OF THE INVENTION

This invention relates to a method of manufacturing a heterostructure laser structure.

REFERENCE TO RELATED APPLICATIONS

This application is related in subject matter to U.S. Patent Application No. 746,761, filed Dec. 2, 1976, now abandoned.

SUMMARY OF THE INVENTION

According to this invention there is provided a method of heterostructure laser manufacture wherein the laser p-n junction is formed in a structure consisting of a pair of layers of opposite conductivity type grown by liquid phase epitaxy and having sandwiched therebetween a quantity of active material of higher refractive index and lower band-gap, wherein the layers are grown on a substrate having a groove in its surface under conditions such that the active material is thicker in the region overlying the center of the groove than elsewhere and wherein a dopant is diffused through one of the layers to translate the portions of the p-n junction not overlying the groove into the material of the other layer while leaving the portion of the p-n junction overlying the center of the groove bounded on at least one side by the lower band-gap active material.

BRIEF DESCRIPTION OF THE DRAWINGS

There follows a description of the manufacture of a laser embodying the invention in a preferred form and of background factors affecting the design and manufacture of the laser. The description refers to the accompanying drawings, in which:

FIGS. 4 and 5 depict lasers made by preferred methods.

DETAILED DESCRIPTION OF THE INVENTION

When a dopant of one conductivity type is diffused into material of the other conductivity type the resulting p-n junction will not lie exactly at the diffusion front. This is because the dopant concentration in the region of the diffusion front is not precisely described by a step function, but has a finite gradient. As a result the p-n junction will in fact lie a short distance behind the diffusion front. However, in the ensuing description the fact of a small separation of the two surfaces will be ignored for the sake of simplifying the description.

U.S. Patent Application No. 746,761 discloses how to make waveguiding structures in semiconductive material by liquid phase epitaxy in a manner which takes advantage of the fact that in liquid phase epitaxy a solution that is just saturated with respect to a plane solid surface would be unsaturated with respect to that surface if the surface were convex and supersaturated with respect to it if it were concave. In particular, the effects obtainable with epitaxial growth on a plane substrate provided with a groove in its surface are disclosed. By suitably adjusting the growth conditions any one of the structures depicted in FIGS. 1, 2 and 3 may be provided, where 1 is the material of the substrate layer and 2 is the epitaxially grown material. To produce the FIG. 1 structure, the growth conditions are such that the melt is supersaturated with respect to concave surfaces only. If the growth conditions are slightly modified so that the melt is now also supersaturated with respect to plane surfaces, the structure of FIG. 2 may be produced. But if the melt is also supersaturated with respect to the convex surfaces at the top edges of the groove, the growth will be in a continuous layer as in FIG. 3.

Figure 1:
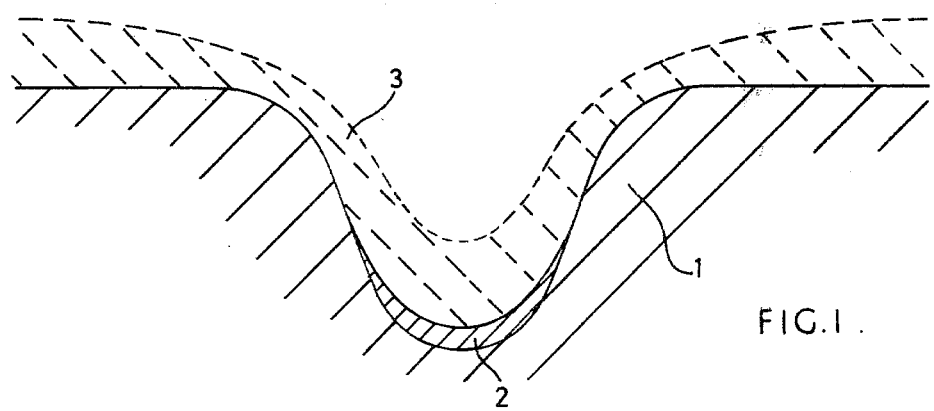
FIGS. 1, 2 and 3 illustrate the effects of the use of a grooved substrate in liquid phase epitaxy under different growth conditions.

The FIG. 1 type of structure can be used to produce heterostructure lasers having strong optical guidance and minority carrier confinement, not only in the direction normal to the plane of the substrate surface, but also in the lateral direction in the plane of the substrate at right angles to the groove. For this purpose, after the growth of material 2, the exposed surface is entirely covered with a further layer 3. The substrate layer 1 and the further layer 3 are of opposite conductivity type, and are made of material having a higher band-gap and lower refractive index than that of the material 2. In the FIG. 1 structure the strip of material 2 is encircled by lower refractive index material, and so there is all round optical guidance. If material 2 is made of a single conductivity type, the p-n junction extends over one surface of the strip, and current flow across the junction is effectively confined to this region because elsewhere the p-n junction is bounded on both sides by the higher band-gap material.

If material 2 is made partly of n-type and partly of p-type, the p-n junction will extend through the strip. Under these circumstances, the current flow across the junction will also be confined to the strip. In general this will not be a preferred configuration because the n-type material has a slightly greater band-gap than p-type material and hence the two parts will have slightly different laser emission wavelengths.

Figure 2:
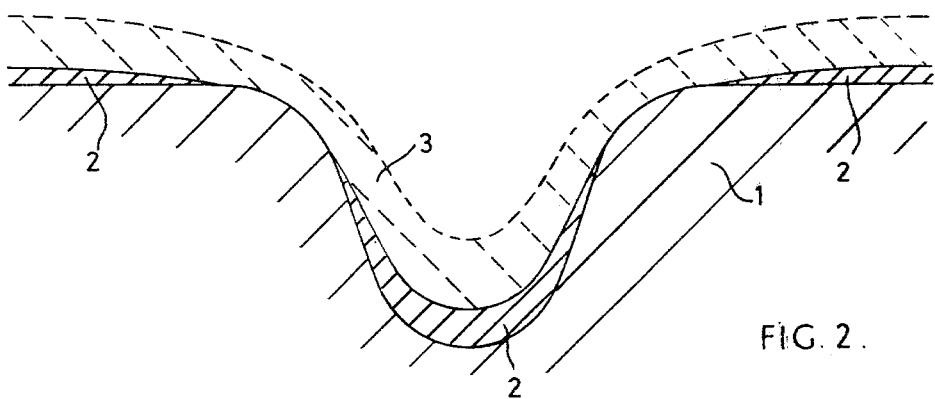
Figure 3:
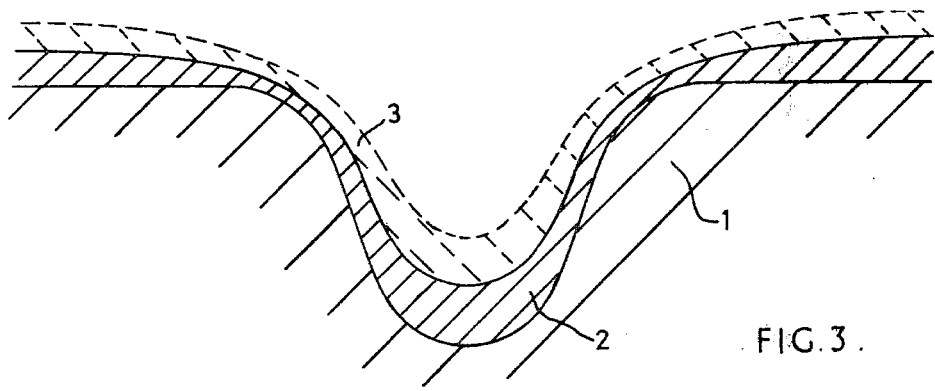

If, however, the laser growth conditions are such as to produce a structure of the FIG. 2 type there is still all round optical guidance for the strip, but the current flow across the p-n junction is no longer confined exclusively to the region of the central strip because there are equally favorable regions of p-n junction at both sides where there has been growth of material 2. Finally if the laser growth conditions are such as to produce a structure of the FIG. 3 type, not only is there no confinement of current flow across the p-n junction, and no lateral confinement of minority carriers, but also the optical guidance in the lateral direction is weakened. It is to be noted that optical guidance in the lateral direction is not eliminated because there is still a residual rib-type guide structure since material 2 is thickest at the center of the groove and thinnest at its side edges.

This invention is primarily concerned with providing the FIG. 2 type structures of laser with improved confinement of current flow across the p-n junction. Referring attention now to FIG. 4, a laser has a p-type substrate 40 of GaAs containing a mobile acceptor dopant such as zinc. This substrate has a groove 41 formed in a surface that is tilted by between $\frac{1}{2}°$ and 3° about a <100> direction from a 100 plane. The groove 41 extends at right angles to this particular <100> direction. The groove will have sides which slope inwardly toward the bottom producing a cross-section in the form of a truncated Vee as a result of reduced etch-rate of 111 planes compared with that of 100 planes. The reason for the choice of the particular orientation of the substrate surface with respect to its crystal planes concerns the rate at which the groove is filled in subsequent epitaxial growth, and this is discussed further in U.S. Patent Application No. 746,761.

Liquid phase epitaxy is then used to grow a succession of four layers 42, 43, 44 and 45. Layer 43 is divided into three regions 43a, 43b and 43c because it is grown under conditions which have no net growth in the two regions where the underlying surface is most convex with respect to the growth melt. Layer 42 is p-type and layers 44 and 45 are n-type, while layer 43 may be p-type or n-type. Layer 43, which is to provide the active material of the laser is grown in $Ga_{1-y}Al_yAs$ where $y \geq 0$. Layers 42 and 44 are grown in $Ga_{1-x}Al_xAs$ where $x > y$ in order to provide the confining properties of the heterojunctions formed between the material of these layers and that of the active material of layer 42. Layer 45 is grown in GaAs and is provided to facilitate the provision of a good electrical connection between the semiconductive material and a top contact provided by a metallization layer 46.

At this stage of manufacture the p-n junction forms a boundary of or extends through each of the three regions 43a, 43b and 43c of the lower band-gap material. Between these regions the p-n junction is bounded on both sides by the higher band-gap material. Therefore if the device were forward biased in this condition the resulting current flow across the junction would be effectively confined to the three regions where it is bounded on at least one side by the lower band-gap material. It is only the current flow across the region of the p-n junction associated with the middle region 43b that contributes to the wanted laser emission, and hence it is desired to inhibit the current flow across the other two regions. This is achieved by causing the mobile dopant of the substrate to diffuse through part of the epitaxially grown layers so as to translate the two portions of the p-n junction originally contiguous with regions 43a and 43c into the overlying higher band-gap material of layer 44. It will be appreciated that the configuration must be such that this condition occurs before the portion of the p-n junction contiguous with region 43b has been translated away into higher band-gap material. In FIG. 4 the position of the diffusion front is indicated by the line 47.

The same diffusion principle can be applied using a mobile dopant diffused from above the active layer instead of from beneath it. If, as before, zinc is used as the mobile dopant the structure may be as depicted in FIG. 5. This has an n-type GaAs substrate so with a groove 51 in its upper surface. The crystal and groove orientations are the same as those of the laser previously described with reference to FIG. 4. Layers 52, 53, 54 and 55 are grown by liquid phase epitaxy. These layers correspond with their equivalent layers 42, 43, 44 and 45 of the FIG. 4 laser except that the conductivity types of layers 52 and 54 are n-type and p-type respectively, instead of the other way round. In this instance the p-type mobile dopant, zinc, is diffused into the device from an external source (not shown). For this purpose it may be preferred to use a source consisting of zinc in solution in gallium saturated with GaAs so as to avoid the problems associated with the diffusion properties of zinc under high arsenic pressure. The diffusion is halted once the diffusion front, indicated by line 57, has translated the regions of the p-n junction originally contiguous with regions 53a and 53c downward into layer 53. After the diffusion a top contact is provided by a metallization layer 56.

The use of this diffusion process, whether from above or from beneath, is still effective in limiting the current flow across the p-n junction to the central region overlying the groove 41 if the growth conditions are such that layer 43 is not divided into the three distinct regions, but is formed as an uninterrupted layer. However, the efficiency of the device is impaired because minority carriers generated in layer 42 by this current flow will not be prevented from leaking laterally in this layer to the wings of the device where they will not contribute to the required laser radiation.

I claim:

1. A method of fabricating a heterostructure laser comprising the steps of:
    forming a p-n junction in a structure comprising a pair of layers of opposite conductivity type grown by liquid phase epitaxy and having sandwiched therebetween a quantity of active material of higher refractive index and lower band gap;
    growing said layers on a substrate having a groove in its surface under conditions such that the active material is grown thicker in the region overlying the center of the groove than elsewhere; and
    diffusing a zinc dopant through one of the layers to translate the portions of the p-n junction not overlying the groove into the material of the other layer while leaving the portion of the p-n junction overlying the center of the groove bounded on at least one side by the lower band-gap active material.

2. The method as claimed in claim 1 wherein the growth of the active material is such that it is formed in three separated regions comprising a central region overlying the groove and two further regions flanking the central region.

3. The method as claimed in claim 1 or 2 wherein the configuration is such that subsequent to the diffusion the portion of the p-n junction overlying the center of the groove is bounded on only one side by the lower band-gap active material.

4. The method as claimed in claim 1 or 2 wherein the laser is grown in $Ga_{1-x}Al_xAs$.

5. The method as claimed in claim 1 or 2 wherein the dopant is diffused through said one of the layers from the substrate.

* * * * *